(12) United States Patent
Park et al.

(10) Patent No.: US 12,167,547 B2
(45) Date of Patent: Dec. 10, 2024

(54) DISPLAY DEVICE AND MOUNTING BRACKET FOR BEZEL

(71) Applicant: Microsoft Technology Licensing, LLC, Redmond, WA (US)

(72) Inventors: Joseph Juseop Park, Bellevue, WA (US); John Charles Meyer, Redmond, WA (US); Bruce James Sandmeyer, Redmond, WA (US); Brian Walter Aznoe, Sherwood, OR (US); Dallas Jamison Cutler, Tigard, OR (US); James David Wahl, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/660,720

(22) Filed: Apr. 26, 2022

(65) Prior Publication Data
US 2022/0256718 A1    Aug. 11, 2022

Related U.S. Application Data

(63) Continuation of application No. 16/270,515, filed on Feb. 7, 2019, now Pat. No. 11,324,128.

(51) Int. Cl.
| | | |
|---|---|---|
| *H05K 5/00* | (2006.01) | |
| *F16M 13/02* | (2006.01) | |
| *H05K 5/02* | (2006.01) | |

(52) U.S. Cl.
CPC .......... *H05K 5/0017* (2013.01); *F16M 13/02* (2013.01); *H05K 5/0008* (2013.01); *H05K 5/0217* (2013.01)

(58) Field of Classification Search
CPC .. H05K 5/0017; H05K 5/0217; H05K 5/0008; F16M 13/02
See application file for complete search history.

(56) References Cited

U.S. PATENT DOCUMENTS 6,930,734 B2 * 8/2005 Lee ................... G02F 1/133308
349/60
7,663,870 B2 * 2/2010 Choi ........................ H04N 5/64
361/818

(Continued)

FOREIGN PATENT DOCUMENTS

CN          108475086 A       8/2018

OTHER PUBLICATIONS

"Office Action Issued in European Patent Application No. 20705859. 5", Mailed Date: Feb. 6, 2023, 4 Pages.

(Continued)

*Primary Examiner* — Rockshana D Chowdhury
*Assistant Examiner* — Douglas R Burtner
(74) *Attorney, Agent, or Firm* — Alleman Hall & Tuttle LLP

(57) ABSTRACT

Examples are disclosed that relate to display devices and mounting brackets for securing a bezel to a display device. In one example, a display device comprises a display unit and a bezel comprising at least one pocket. The display device comprises a mounting bracket comprising a display unit attachment portion affixed to the display unit and at least one tongue that extends at least partially into the at least one pocket. Adhesive binds the at least one tongue to at least one surface of the at least one pocket, thereby coupling the bezel to the display unit via the mounting bracket.

14 Claims, 13 Drawing Sheets

(56) References Cited

U.S. PATENT DOCUMENTS

| | | | | |
|---|---|---|---|---|
| 7,697,272 | B2* | 4/2010 | Choi | G02F 1/133308 |
| | | | | 361/679.21 |
| 7,760,491 | B2* | 7/2010 | Choi | H04N 5/64 |
| | | | | 361/679.01 |
| 7,889,484 | B2* | 2/2011 | Choi | G02F 1/133308 |
| | | | | 361/679.21 |
| 7,948,574 | B2* | 5/2011 | Chen | G02F 1/133308 |
| | | | | 361/679.01 |
| 8,761,836 | B2* | 6/2014 | Joo | H04M 1/185 |
| | | | | 455/90.3 |
| 9,414,507 | B2* | 8/2016 | Lv | H05K 5/0017 |
| 9,535,207 | B2* | 1/2017 | Youk | G02B 5/0242 |
| 10,952,552 | B2* | 3/2021 | Hernandez | A47G 1/1626 |
| 11,022,829 | B2* | 6/2021 | Ishida | G02F 1/133308 |
| 2011/0116217 | A1* | 5/2011 | Lee | H05K 5/0217 |
| | | | | 361/679.01 |
| 2011/0287812 | A1* | 11/2011 | Joo | H04M 1/185 |
| | | | | 455/566 |
| 2014/0063699 | A1* | 3/2014 | Nezu | H05K 5/02 |
| | | | | 361/679.01 |
| 2014/0104504 | A1* | 4/2014 | Kuwajima | H05K 5/02 |
| | | | | 348/843 |
| 2015/0015793 | A1* | 1/2015 | Noguchi | H05K 5/0004 |
| | | | | 348/725 |
| 2015/0373857 | A1* | 12/2015 | Chikazawa | H05K 5/02 |
| | | | | 361/679.01 |
| 2016/0233573 | A1* | 8/2016 | Son | H05K 5/0017 |
| 2016/0234949 | A1* | 8/2016 | Seo | H04M 1/0266 |
| 2017/0013727 | A1* | 1/2017 | Lee | H05K 5/0017 |
| 2019/0008055 | A1* | 1/2019 | Chen | G02F 1/133308 |
| 2024/0015236 | A1* | 1/2024 | Tang | H04M 1/0216 |

OTHER PUBLICATIONS

Communication pursuant to Article 94(3) Received in European Patent Application No. 20705859.5, mailed on Nov. 23, 2023, 2 pages.

Notice on Grant Received for Chinese Application No. 202080013333.1, mailed on May 1, 2024, 7 pages. (English translation provided).

Office Action Received for Chinese Application No. 202080013333.1, mailed on Nov. 24, 2023, 12 Pages (English Translation Provided).

* cited by examiner

DISPLAY DEVICE AND MOUNTING BRACKET FOR BEZEL

CROSS REFERENCE TO RELATED APPLICATIONS

This application is a continuation of U.S. patent application Ser. No. 16/270,515, filed Feb. 7, 2019, the entirety of which is hereby incorporated herein by reference for all purposes.

BACKGROUND

A display device may include a bezel to provide protection from various forces, such as user handling. The bezel may also be expected to provide the device with a pleasing appearance and form factor that does not interfere with a user's experience.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to display devices and mounting brackets for securing a bezel to a display device. In one example, a display device comprises a display unit and a bezel comprising at least one pocket. The display device comprises a mounting bracket comprising a display unit attachment portion affixed to the display unit and at least one tongue that extends at least partially into the at least one pocket. An adhesive binds the at least one tongue to at least one surface of the at least one pocket, thereby coupling the bezel to the display unit via the mounting bracket.

Another example provides a mounting bracket for securing a bezel to a display unit of a display device. The mounting bracket comprises a display unit attachment portion comprising a planar face configured to be affixed to the display unit, and at least one tongue configured to be affixed to an inner sidewall of the bezel. The at least one tongue comprises a planar surface that is angled with respect to the planar face of the display unit attachment portion.

Another example provides a method for assembling a display device. The method comprises positioning a bezel relative to a display unit, the bezel comprising at least one pocket. The method further comprises dispensing an adhesive into the at least one pocket, and providing a mounting bracket comprising a display unit attachment portion configured to be affixed to the display unit, and at least one tongue configured to extend at least partially into the at least one pocket. The tongue is positioned at least partially within the at least one pocket and the adhesive, and the display unit attachment portion is affixed to the display unit.

DETAILED DESCRIPTION

Figure 1:
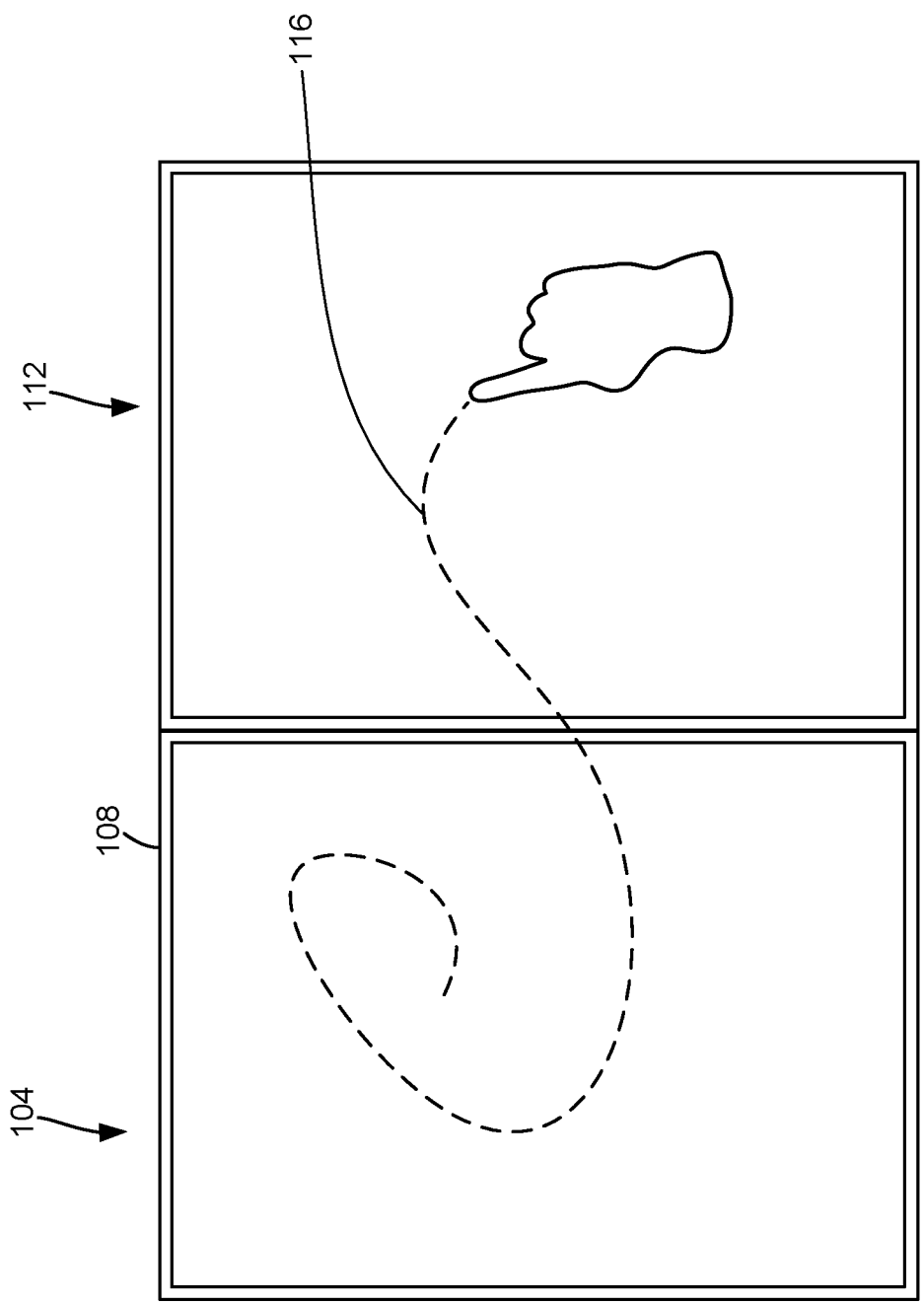
FIG. 1 shows an example of two display devices according to examples of the present disclosure.

A display device may include a bezel to provide protection from various forces, such as user handling. The bezel may surround and protect various components of the device, such as an internal display unit. The bezel may also be expected to provide the device with a pleasing appearance and a form factor that does not obstruct or otherwise interfere with a user's experience and interactions with the display device.

In some examples, components of a display device may have dimensions or shapes that vary from one unit to the next. For example, manufacturing variations may result in a display surface with minor differences in length, width, and/or thickness. Similarly, the thickness of a device's touch display module or particular components of the module may vary.

To accommodate such variations, in some examples a bezel may be configured to wrap around the display surface while leaving a gap between itself and the display surface. In this manner, the bezel may provide the device with mechanical protection, and the gap may accommodate some degree of variation in the dimensions and/or the shapes of the components. For example, a slightly thicker display surface may still fit within tolerances provided by the gap.

However, such gaps may create a less pleasing appearance and/or undesirably increase the form factor of the device. Further, wrapping the bezel around a front surface of the display may interfere with the user's interactions and use of the device. For example, portions of the bezel wrapped around the front surface may reduce an active area of the display, and may block portions of the area in which images are displayed and in which touch-screen devices may receive user input. In large or heavy display devices, such as all-in-one computing devices and smart whiteboards, a larger bezel may be utilized to support additional components. Especially in these examples, the larger and more prominent bezel can interfere with user interactions and further reduce the active area of the display.

In some examples of display devices, the bezel can physically interfere with the user providing touch gestures to a touch-sensitive screen. For example, when the bezel is wrapped around the front of the display, the user's finger may hit the bezel when performing a touch gesture. In other examples, two or more touch-sensitive display devices may be arranged adjacent to one another in a tiled configuration. The displays may be integrated via a shared user interface to enable a user to provide a continuous touch input that spans across the display devices. In these examples, where each display includes a bezel that wraps around the front display surface, the protruding bezels create a physical barrier between adjacent display surfaces. Accordingly, when a user performs a touch gesture that spans across two displays, the user's finger or stylus is physically interrupted by the protruding bezels.

In some examples, it may be desirable to affix the bezel behind the display surface. In this manner, the physical barrier between tiled devices may be avoided. However, it may be difficult to affix the bezel to both the display surface and another structural component of the device, and to properly position and align the bezel, display surface and other components, without introducing potentially damaging internal stresses. Additionally, these configurations may not allow three-dimensional adjustments to the relative positions of the bezel, display surface and internal components that may be necessary to achieve uniform spacings and gaps, and to account for variations in component dimensions and locations, such as display glass to bezel spacings and different display module sizes. Thus, in some display devices that affix the bezel behind the display surface, when component dimensions vary from unit to unit, the assembly processes that affix the bezel to the display surface and to other structural components of the device can introduce potentially harmful component stresses, and may struggle to produce consistent and uniform tolerances and component alignments.

Accordingly, and as described in more detail below, the present disclosure is directed to display devices, mounting brackets and methods for assembling display devices that may address one or more of the above-described issues. With reference now to FIG. 1, one example of a display device 104 comprising a bezel 108 and mounting brackets according to aspects of the present disclosure is schematically illustrated. The bezel 108 may surround at least a portion of the display device 104. In the example of FIG. 1, the bezel 108 surrounds an entire perimeter of the display device 104. As described in more detail below, in some examples the bezel 108 may comprise two or more sections that are joined together.

In the example of FIG. 1, the display device 104 is arranged in a tiled configuration adjacent to a second display device 112, which may also utilize bezels and mounting brackets as described herein. Both display devices 104, 112 may comprise touchscreen displays that may be integrated via a shared user interface. In this manner, a user may provide touch input, such as a touch gesture 116, that spans both display devices 104, 112.

As described in more detail below, each display device may utilize a plurality of mounting brackets that couple a bezel to a display unit, such as a touch display module or a backlight unit. In one potential advantage of the present disclosure, the mounting brackets couple the bezel to the display unit in a manner that enables three-dimensional positioning of the bezel relative to the display unit to meet tolerance and alignment requirements in all three x, y and z directions. In this manner, the bezel may be securely affixed to the display unit while also allowing for variations in the length, width and height of the display unit and variations in the display surface (glass) length, width and thickness. Additionally, the disclosed bezel and mounting bracket configurations enable such secure coupling and the performance of adjustments to accommodate such variations without introducing internal loads or stresses that may compromise structural integrity or otherwise damage components. Further, the disclosed bezel and mounting bracket configurations enable the bezel to be attached to the backside of the display surface, thereby avoiding bezel components protruding above the display surface.

Figure 2:
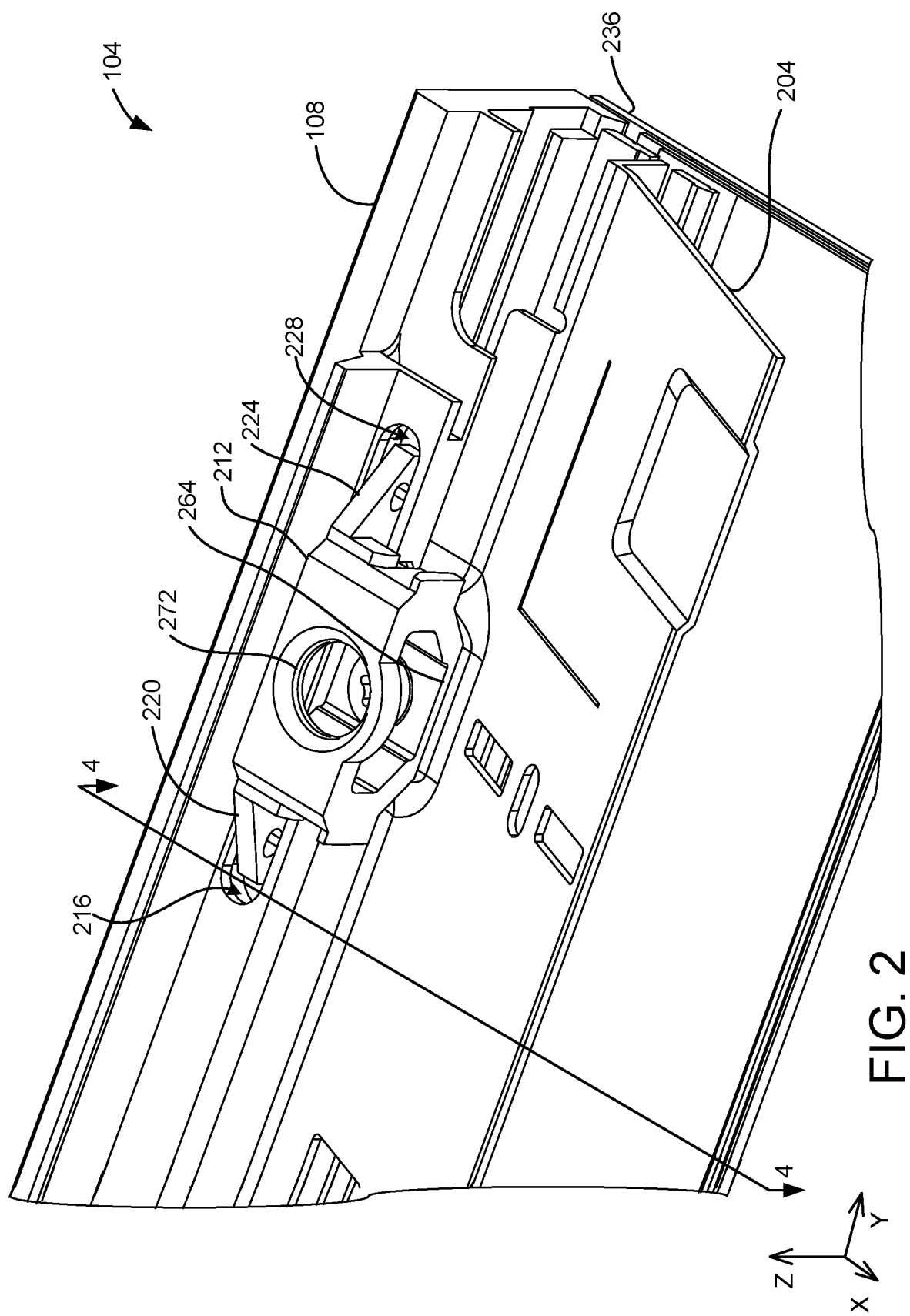
FIG. 2 illustrates a portion of one of the display devices of FIG. 1 including a side mounting bracket according to examples of the present disclosure.

With reference now to FIGS. 2-10, examples of mounting brackets that may be used to affix a bezel to a display unit according to aspects of the present disclosure are illustrated. FIG. 2 illustrates a portion of display device 104 that comprises a display unit 204, shown here as a chassis configured to enclose a backlight unit of the display. The display unit 204 may serve as a foundation to which the mounting brackets and/or other components of the display device 104 may be attached. In this example, bezel 108 is coupled to the display unit 204 via a side mounting bracket 212. In different examples, display device 104 may include a plurality of mounting brackets 212 located around its perimeter for securing one or more sections of a bezel to the display unit.

As described in more detail below, the bezel 108 comprises at least one pocket configured to receive a portion of the side mounting bracket 212. The side mounting bracket 212 comprises at least one tongue that corresponds to the pocket in the bezel 108. In the example shown in FIGS. 2-10, the bezel 108 includes a first pocket 216 and a second pocket 228 located opposite to the first pocket. Similarly, the mounting bracket 212 comprises a first tongue 220 extending from one end of the bracket and a second tongue 224 that extends from the opposite end of the bracket. In some examples, the first tongue 220 and the second tongue 224 have substantially the same shape. In the present example, the first tongue 220 and the second tongue 224 comprise similarly-shaped flanges that extend from opposite ends of the side mounting bracket 212. In other examples the tongues may take any suitable form, including differently shaped structures. Another possible configuration of the tongues is described in more detail below with reference to FIGS. 11 and 12. Additionally and in other examples, a side mounting bracket may comprise a single tongue configured to extend into a single pocket.

Figure 3:
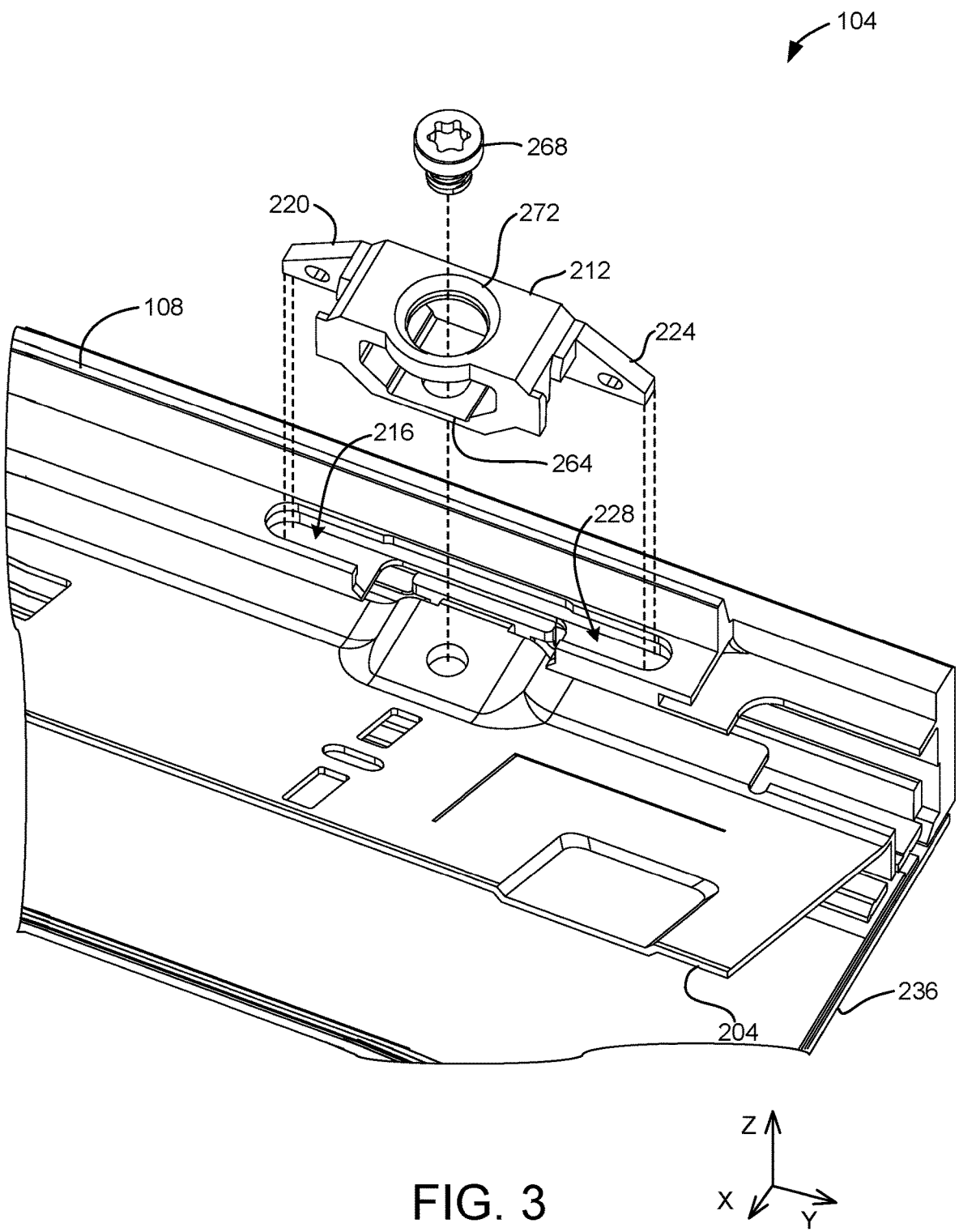
FIG. 3 shows an exploded view of the portion of the display device of FIG. 2.
Figure 4:
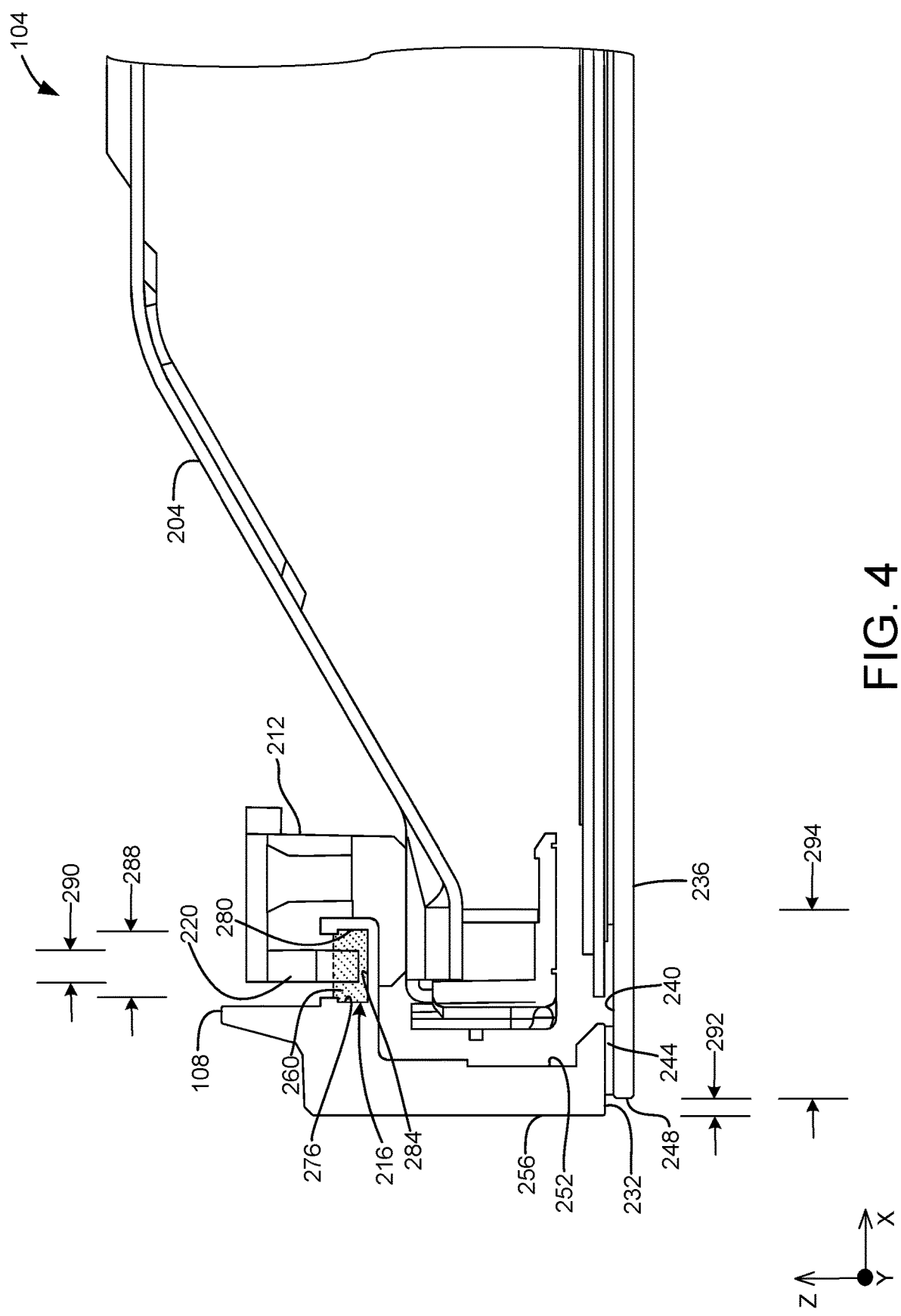
FIG. 4 shows a cross section view of the portion of the display device illustrated in FIG. 2 taken along line 4-4 of FIG. 2.
Figure 5:
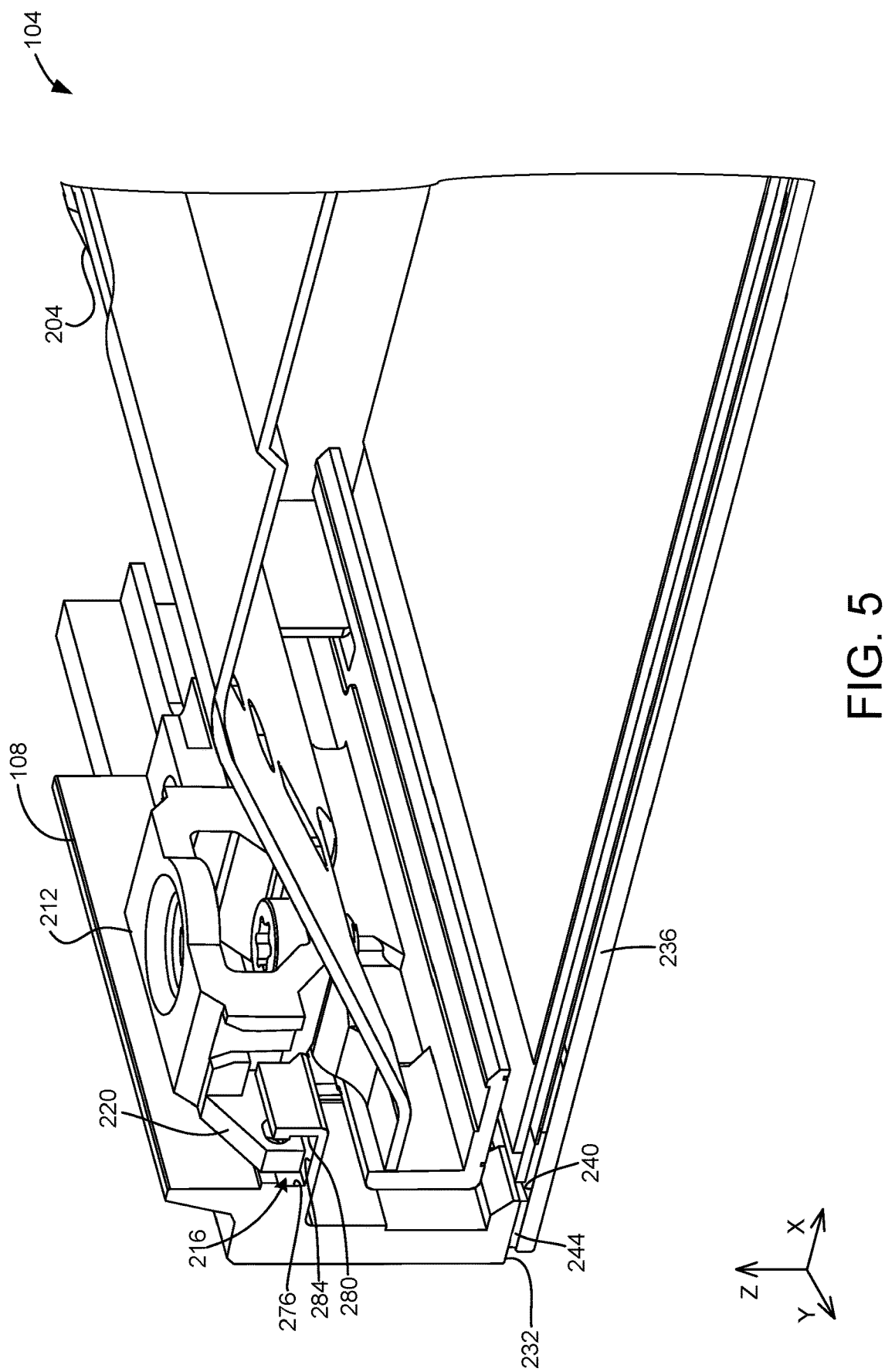
FIG. 5 shows another view of the side mounting bracket and a portion of the display device of FIG. 2.

As shown in FIGS. 2-5, the tongues 220, 224 are configured to extend at least partially into their corresponding pockets 216, 228. As shown in FIGS. 4 and 5 and as described in more detail below, each pocket 216, 228 is larger than its corresponding tongue 220, 224. Accordingly, when tongues 220, 224 are positioned within their corresponding pockets 216, 228, the pockets provide room for the side mounting bracket 212 to be moved and repositioned in any of the x, y and z-directions. As described in more detail below, once a bracket is properly positioned and affixed to the display unit, adhesive deposited in the pockets binds the tongues to at least one surface of the pockets, thereby coupling the bezel 108 to the display unit 204 via the side mounting bracket 212.

The tolerance and room for movement of the side mounting bracket 212 that is provided by the tongues 220, 224 and pockets 216, 228 enable the bezel 108 to be properly aligned and securely mounted to both a surface of the display and to the display unit 204. With reference now to FIG. 4, a cross-section of the display device 104 through side mounting bracket 212 is illustrated. As shown in this example, a front face 232 of the bezel 108 is positioned adjacent to a display surface 236, such as a sheet of glass or plastic that forms the surface of the display. In some examples, the front face 232 may be affixed to an underside 240 of the display surface 236 using an adhesive 244. This configuration is also illustrated in FIG. 5, which shows another view of the display device 104. In this manner, the bezel 108 does not project outwardly beyond the user-facing side of the display surface 236, and thus will not interfere with a user's touch interactions with the surface.

Further, and with continued reference to FIG. 4, by mounting the bezel 108 on the underside 240 of the display surface 236, this configuration may enable a reduction in the width of a mask area 294 around the perimeter of the display device 104. Correspondingly, the active display area of display surface 236 interior to the mask area 294 may be increased. Additionally, by mounting the bezel 108 on the underside 240 of the display surface 236, the display device may utilize a smaller step 292 from a side edge 248 of the display surface to the outer sidewall 256 of the bezel as compared to other configurations in which the bezel wraps around the display surface. In these examples, an inner sidewall 252 and the front face 232 of the bezel may remain behind the display surface 236, rather than extending around a side edge 248 and over a front portion of the surface. Accordingly, the outer sidewall 256 of bezel 108 may project a shorter distance along the x-axis from the side edge 248 of the display surface 236 as compared to devices in which the bezel wraps around the display surface. In this manner, the display device 104 may utilize a smaller step 292 from the side edge of the display surface 236 to the outer sidewall 256 of the bezel. This may reduce gaps between the active display areas of two or more displays placed adjacent to one another in a tiled configuration.

As noted above, the bezel 108 may be affixed to the underside 240 of the display surface 236 via an adhesive 244, such as a sheet of pressure-sensitive-adhesive (PSA) between the display surface 236 and the front face 232 of the bezel. The adhesive 244 may be applied to the front face 232 of the bezel 108 or to the display surface 236 prior to positioning the bezel 108 relative to the display unit 204. For example, the display device 104 may be assembled by first applying the adhesive 244 to the display surface 236, then aligning the bezel 108 relative to the display unit 204 and bonding the bezel to the display surface via the adhesive.

With continued reference to FIG. 4 and as noted above, once a side mounting bracket 212 is positioned and affixed to the display unit 204, adhesive 260 in the first pocket 216 binds the first tongue 220 to interior surface(s) of the pocket to thereby couple the bezel 108 to the display unit via the side mounting bracket. In a similar manner, adhesive in the second pocket 228 of bezel 108 binds the second tongue 224 to interior surface(s) of the pocket to couple the bezel 108 to the display unit. It will be appreciated that the following disclosure describing the first pocket 216 and first tongue 220 are equally applicable to the second pocket 228 and second tongue 220.

In some examples, an adhesive 260 may be dispensed into the first pocket 216 prior to installing the side mounting bracket 212. As illustrated by the dashed line in FIG. 4, the adhesive 260 may fill at least a portion of the first pocket 216. In other examples, the adhesive 260 may be dispensed into the first pocket 216 after installing the side mounting bracket 212.

It will be appreciated that any suitable adhesive may be utilized in the pocket 216. For example, the adhesive may comprise a hot-melt adhesive or a multi-component adhesive, such as a two-part epoxy. In some examples where the adhesive is dispensed into the pocket prior to installing a side mounting bracket, the adhesive may comprise a high-viscosity adhesive. In this manner, the adhesive 260 may permit installation of the first tongue 220 into the first pocket 216 while the adhesive is still malleable. In some examples, when the first tongue 220 is pressed through the adhesive 260, the adhesive 260 may part and wick up to one or more sides of the tongue 220. In other examples where the adhesive is dispensed into a pocket after installing the side mounting bracket, a lower-viscosity adhesive may be utilized. Accordingly, and in one potential advantage of the present disclosure, utilizing an adhesive with the tongue and pocket configuration described above enables the side mounting bracket 212 to be moved and positioned in all three x, y and z directions, and the bracket to be affixed to display unit 204, before the adhesive fully cures or solidifies to create a solid joint. For example, the adhesive 260 may be cured via ultraviolet light, air, moisture, combinations of the foregoing, or any other suitable mechanism after the mounting bracket 212 is installed.

For example, as described above, the first pocket 216 provides tolerance for the first tongue 220 and side mounting bracket 212 to translate and rotate in three dimensions while at least a portion of the first tongue is positioned in the pocket 216. In the example illustrated in FIGS. 2-5, the first pocket 216 comprises a U-shaped groove defined by a first surface 276, an opposing second surface 280, and a bottom surface 284. As illustrated by example in FIG. 4, the first surface 276 and the second surface 280 may be spaced apart in the x-axis direction such that a width 288 of the pocket 216 is greater than a width 290 of the tongue.

With reference again to FIG. 2, the first pocket 216 also is longer along the y-axis than the portion of the first tongue 220 inside the pocket 216. Accordingly, as illustrated in FIGS. 2-5, the first pocket 216 provides space for the first tongue 220 to move about the x-,y-, and z-axes while at least the portion of the tongue 220 remains within the pocket 216 and adhesive 260. In this manner, the first pocket 216 and first tongue 220 provide tolerance for translation and rotation of the side mounting bracket 212.

With reference now to FIG. 3, the side mounting bracket 212 comprises a display unit attachment portion 264 that may be affixed to the display unit 204. For example, the side mounting bracket 212 may be affixed to the display unit 204 via an externally threaded fastener, such as screw 268, extending through the display unit attachment portion 264 into the display unit. The screw 268 may enable the side mounting bracket 212 and bezel 108 to be removed from and re-secured to the display unit 204, facilitating later access to display components.

As noted above, the side mounting bracket 212 may be affixed to the display unit 204 via screw 268 before the adhesive in pockets 216 and 228 fully cures or solidifies. Accordingly, and in one potential advantage of the present disclosure, the freedom of movement of the tongues 220, 224 in pockets 216, 228 enables the side mounting bracket 212 to be affixed to the display unit 204 without creating internal component stresses from the applied forces, such as torque from tightening the screw 268. In this manner, the side mounting bracket 212 may float within the tolerances provided by the tongues 220, 224 and pockets 216, 228 to change position and/or orientation, rather than absorbing and transmitting such forces. Further, the tolerances provided by this configuration allow for minor differences in the position and/or orientation of the bezel 108 relative to the display unit 204, thereby compensating for variation among the components of the display device 104.

As illustrated in FIG. 2, the side mounting bracket 212 may include additional features. For example, the side mounting bracket 212 may comprise a cover attachment portion 272 for mounting a backside cover to the display device 104. In the example of FIG. 2, the cover attachment portion 272 comprises a threaded bore for a corresponding threaded fastener. In this manner, the bore may provide an attachment structure for affixing the backside cover to the display device 104 and may also provide access to the screw 268.

As noted above, in some examples a display device may include a plurality of side mounting brackets 212 to secure a bezel or multiple sections of a bezel to a display unit. In one example, such as in the display device 104 described above, the bezel 108 may be mounted to the display device by 36 side mounting brackets located around the perimeter of the device. Each side mounting bracket of the plurality of brackets is secured to corresponding pockets in the bezel as described above. In other examples, any suitable number of side mounting brackets may be utilized.

In some examples, in addition to or instead of using side mounting brackets 212, a display device may utilize one or more mounting brackets having a different configuration. For example and with reference now to FIGS. 6-8, in some examples the display device 104 may utilize one or more corner mounting brackets 616 located in a corner 620 of the bezel 108.

Figure 7:
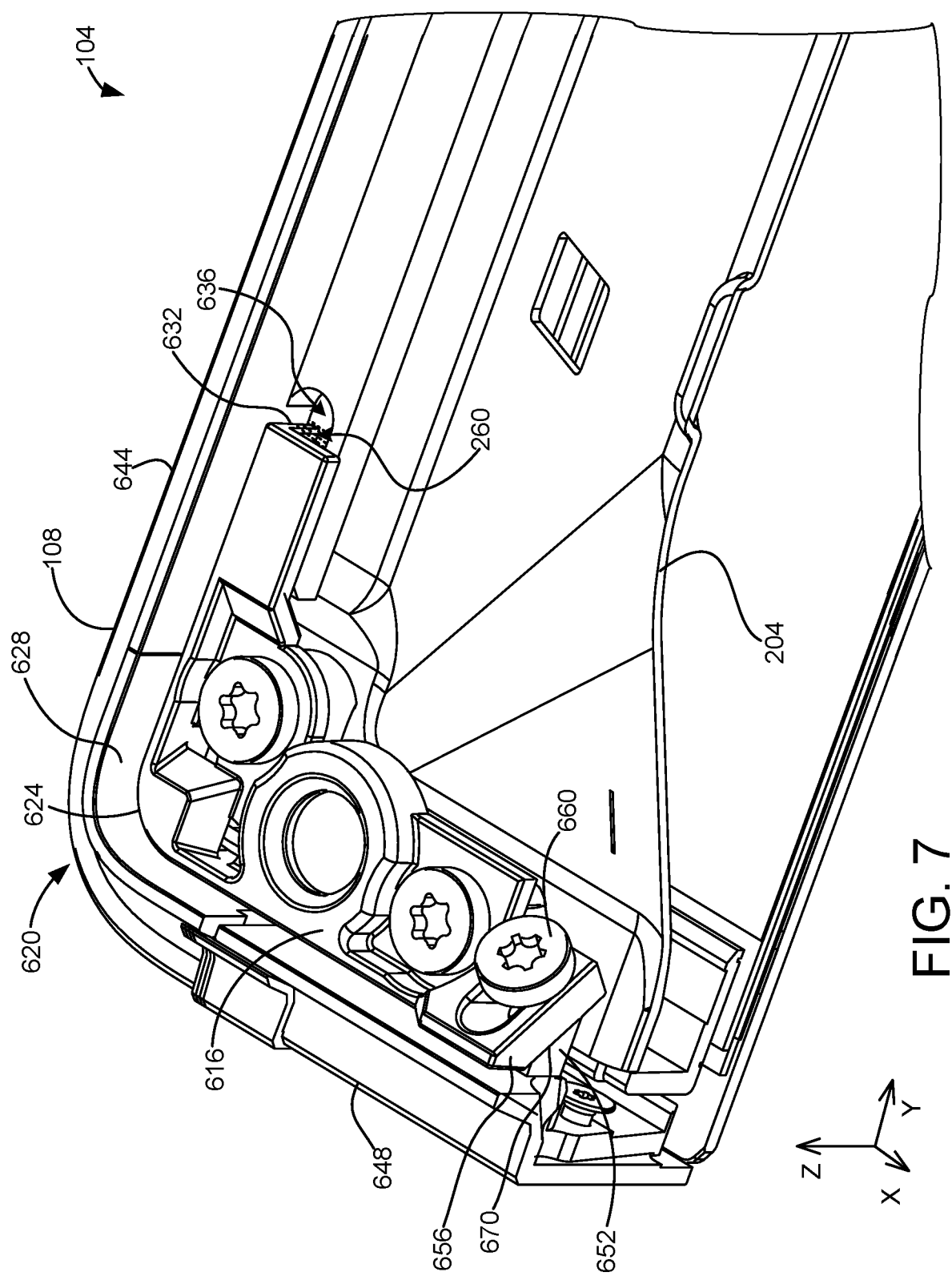
FIG. 7 shows another partial view of a corner of the display device of FIG. 6.
Figure 8:
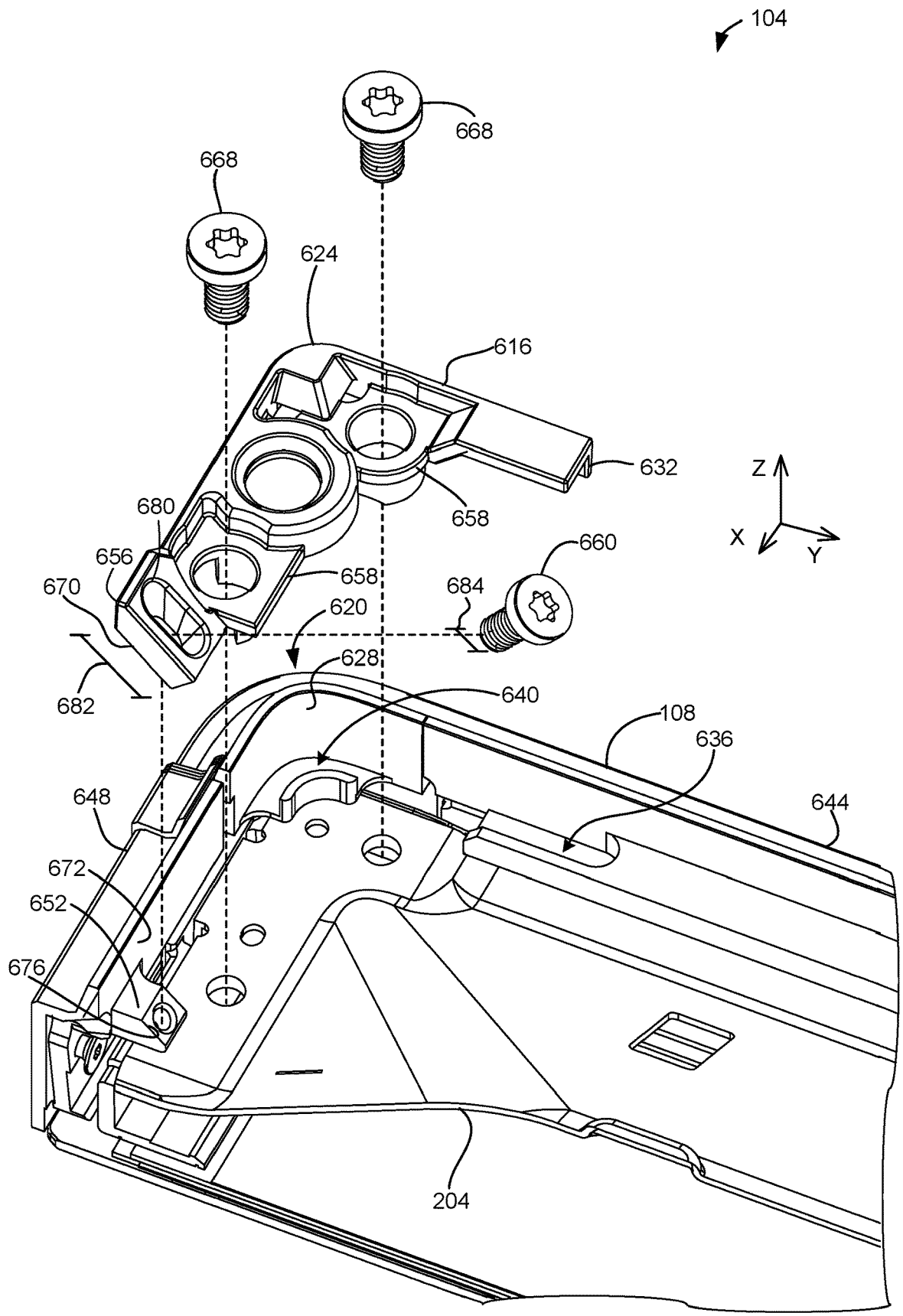
FIG. 8 shows an exploded view of the corner mounting bracket of FIG. 7 according to examples of the present disclosure.

With reference to FIGS. 7 and 8, the corner mounting bracket 616 may comprise a shape that enables it to occupy a corner 620 of the bezel 108. For example, the corner mounting bracket 616 may include a rounded corner 624 that follows a contour of at least a portion of the corner 620 of the bezel. In other examples, the corner mounting bracket 616 may have an angled or sharp corner, or other suitable configuration that extends around the corner 620. In this manner, the corner mounting bracket 616 may be contoured to fit directly adjacent to an inner sidewall 628 of the bezel 108.

FIG. 8 shows an exploded view of the corner mounting bracket 616 and the corner 620 of display device 104. As illustrated in FIG. 8, the corner mounting bracket 616 comprises at least some features that are similar to the side mounting bracket 212. For example, the corner mounting bracket 616 comprises a tongue 632 that extends at least partially into a side pocket 636 within the bezel 108. As shown in FIGS. 7 and 8, the tongue 632 may comprise an L-shaped flange with a downwardly-extending portion that extends into the side pocket 636 when installed. As described in more detail below, and similar to the side mounting bracket 212, when a corner mounting bracket 616 is positioned and affixed to the display unit 204, adhesive 260 (indicated by dashed lines in FIG. 7) in the side pocket 636 binds the tongue 632 to interior surface(s) of the pocket to thereby couple the bezel 108 to the display unit via the corner mounting bracket.

In some examples, the downwardly-projecting tongue 632 may comprise a curved portion that extends around the corner 624 of the corner mounting bracket 616. The bezel 108 may include a similarly-curved corner pocket 640 at the corner 620 of the bezel. The curved portion of the tongue 632 may be positioned within the corner pocket 640 in a manner similar to the downwardly-extending portion of the tongue within the side pocket 636. Adhesive in the corner pocket 640 (not shown) binds the curved portion of the tongue 632 to interior surface(s) of the pocket to further couple the bezel 108 to the display unit via the corner mounting bracket. In this manner, the corner mounting bracket 616 may provide additional support in the corner 620 of the bezel 108.

It will also be appreciated that the bezel 108 may comprise any suitable arrangement of pockets, such as one or more side pockets 636, one or more corner pockets 640, various combinations of side and corner pockets, as well as first and second pockets 216, 228 for side mounting brackets 212 as described above.

Figure 6:
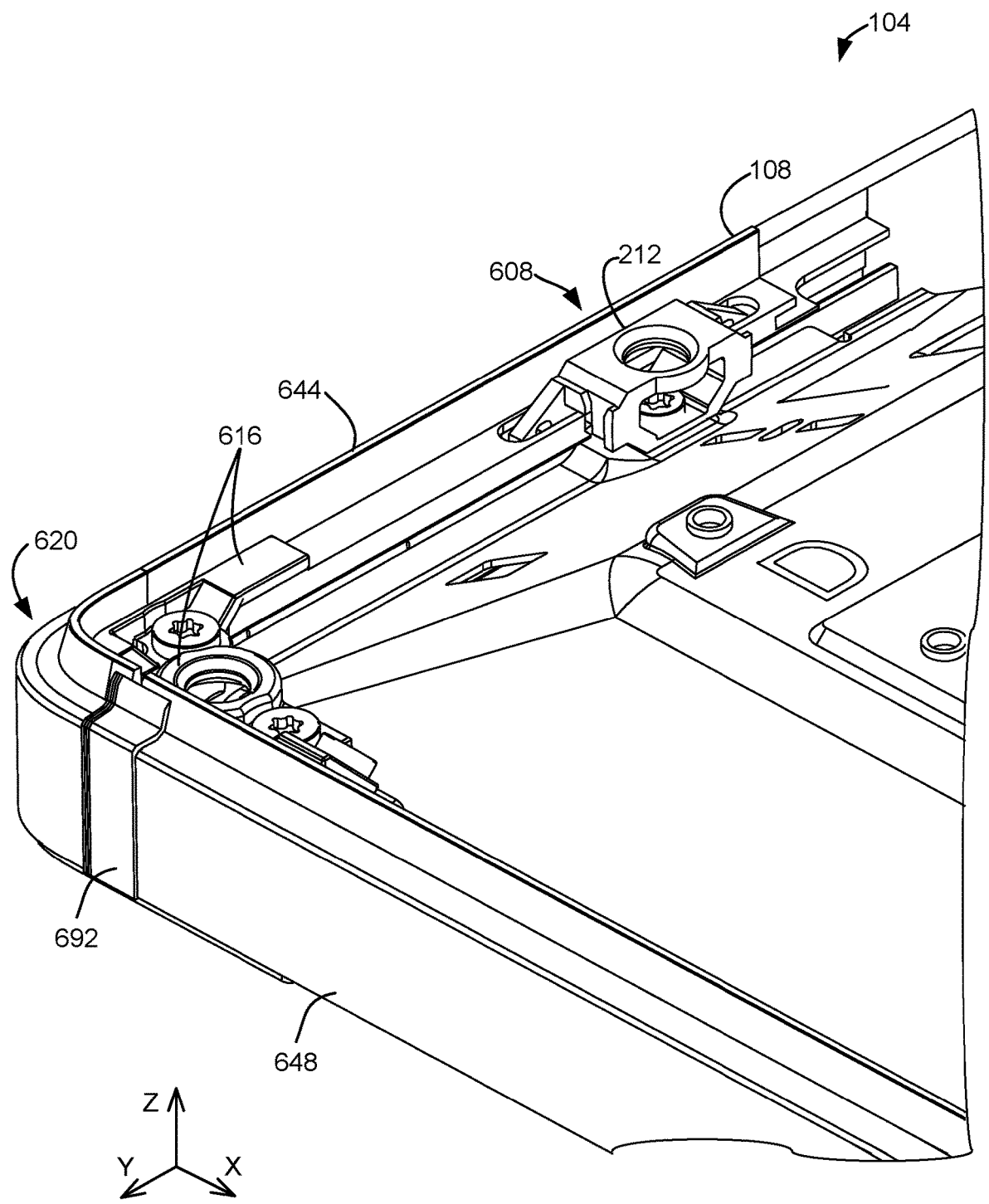
FIG. 6 illustrates another portion of the display device of FIG. 2 including a side mounting bracket and a corner bracket according to examples of the present disclosure.

In some examples, the bezel 108 may comprise one or more different sections that may be interconnected to form the complete bezel. For example, the bezel 108 of the display device 104 described herein may comprise four independent sections that are connected as described below. FIGS. 6-8 illustrate a first section 644 that includes the corner 620 and a second section 648.

As illustrated in FIGS. 7 and 8, the second section 648 of the bezel 108 may comprise a boss 652. The boss 652 may be utilized to affix a bezel attachment portion 656 of the corner mounting bracket 616 to the second section 648. For example, the boss 652 and the bezel attachment portion 656 may be fastened together by a fastener, such as screw 660. In this manner, the second section 648 of the bezel may be secured to the corner mounting bracket 616 via a fixed attachment on at least one end of the section.

The corner mounting bracket 616 is affixed to the display unit 204 via one or more display unit attachment portions of the bracket. In this example, two screws 668 extend through two apertures in display unit attachment portions 658 and into corresponding apertures in the display unit 204. In some examples, the bezel attachment portion 656 of the corner mounting bracket 616 may be affixed to the boss 652 after affixing the corner mounting bracket 616 to the display unit 204 as described above. For example, torque applied while tightening screws 668 may result the corner mounting bracket 616 changing position and/or orientation, in a manner similar to that described above regarding the side mounting brackets 212.

As described in more detail below, the bezel attachment portion 656 and the boss 652 may be configured to contact and move relative to each other prior to tightening the screw 660. In one example, the bezel 108 may be positioned and the corner mounting bracket 616 affixed to the display unit 204, after which the bracket is then secured to the boss 652 of the bezel 108 via the bezel attachment portion 656. In this manner, utilizing this configuration may avoid the generation of internal stress in components of the display device.

Further, the configuration of the tongue 632 and the pockets 636, 640 may provide tolerances for the corner mounting bracket 616 to move at least in an X-Y plane. In some examples, independent motion of the second section 648 of the bezel 108 may provide additional tolerance.

To provide additional freedom of movement along the z-axis, the bezel attachment portion 656 may be angled relative to an inner sidewall 672 of the second section 648 of the bezel 108. In this example, the bezel attachment portion 656 comprises a contacting face 670 that is angled relative to an inner sidewall 672 of the second section 648 when the corner mounting bracket 616 is installed (see also FIG. 7) and affixed to the display unit 204. The bezel attachment portion 656 is also angled relative to the planar faces of the display unit attachment portions 658 of the bracket. The boss 652 also comprises an angled surface 676 that matches the contacting face 670 of the bezel attachment portion 656. In this manner, the angled contacting face 670 and angled surface 676 of the boss 652 enable the corner mounting bracket 616 to move about the z-axis while at least portions of the bezel attachment portion 656 and the boss 652 remain in contact.

To accommodate relative movement between the bezel attachment portion 656 and the boss 652, the bezel attachment portion 656 may comprise a screw slot 680 that is larger than the shank of the screw 660 in at least one dimension. In the example illustrated in FIG. 8, the screw slot 680 has a length 682 greater than a shank diameter 684 of the screw 660. Accordingly, the screw 660 may be fastened in a variety of positions within the screw slot 680, providing additional tolerance for the position and orientation of the corner mounting bracket 616.

With reference again to FIG. 6, each of the independent sections of the bezel 108 may comprise one corner, such as corner 620. For example, a rectangular display device, such as the display device 104 of FIG. 1, may comprise four independent bezel sections, each comprising one corner. In FIG. 6, the first section 644 of the bezel 108 comprises the corner 620. A corresponding corner of the second section 648 of the bezel 108 is not shown. In this example and as illustrated in FIG. 6, the independent sections of the bezel 108 are joined at a side portion of the device rather than in the corner 620. In this manner, separation between the bezel sections may be less apparent to the user, and the device may be able to better withstand impacts at the corner 620 without damaging or separating the bezel sections.

Figure 9:
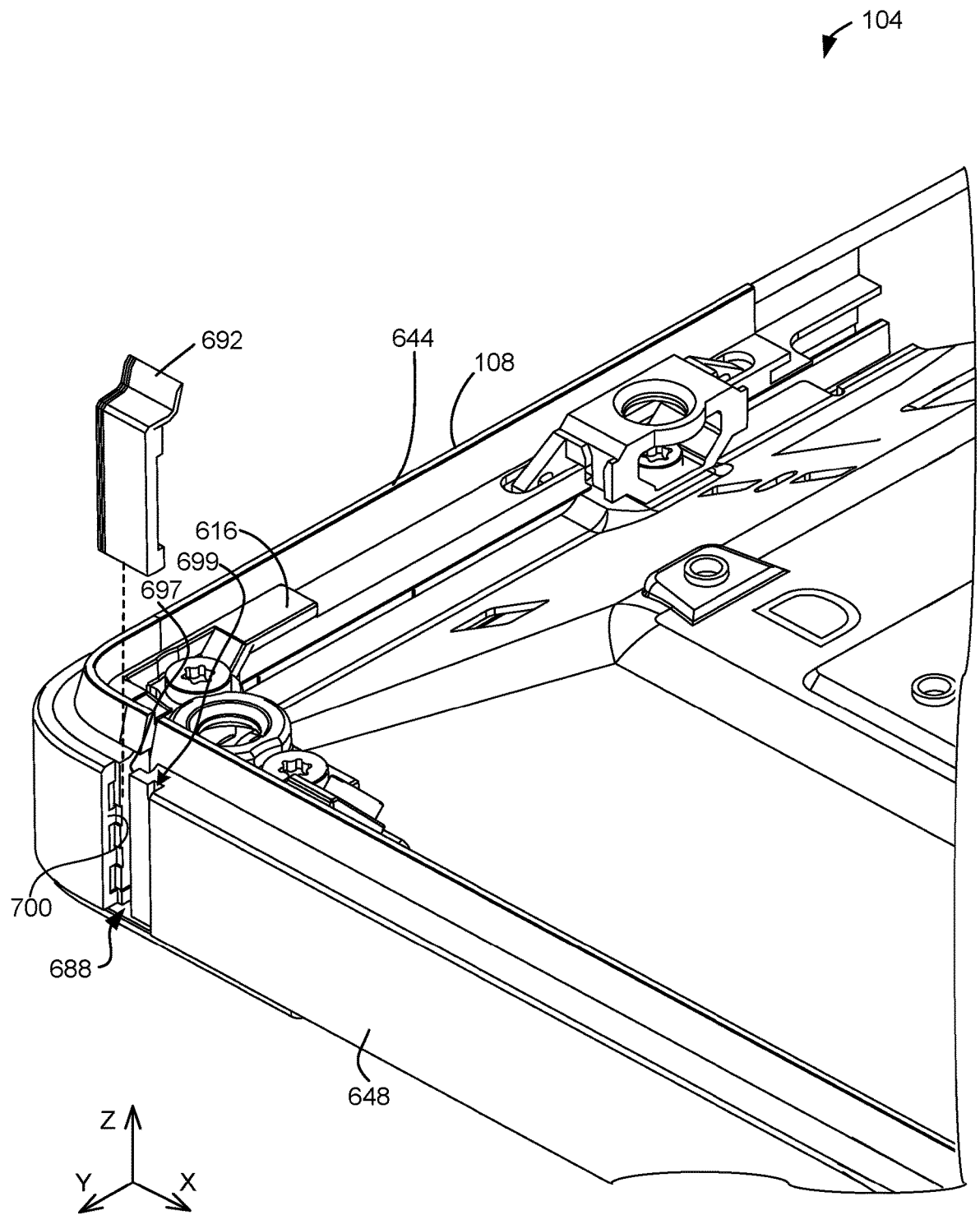
FIG. 9 shows an exploded view of a bumper according to examples of the present disclosure.

To assemble such a display device, in some examples all four bezel sections may be aligned at once by machinery using suitable alignment sensors. With reference now to FIG. 9, adjacent sections of the bezel may form a gap 688 between the sections. The gap 688 may allow each section to move independently, providing additional tolerance to account for variations in the shapes and dimensions of other display device components.

The gap 688 may be measured during manufacturing, and those measurements used to select an appropriately sized bumper 692 to position between the first section 644 and the second section 648 of the bezel 108. As shown in the example of FIG. 6, when inserted between the first section 644 and the second section 648, the bumper 692 may cover the gap 688 and provide a consistent aesthetic appearance.

In some examples, affixing a bumper to both bezel sections when the two sections are misaligned could produce an undesirable and noticeable tilt in the bumper. Accordingly, and with reference to FIGS. 9 and 10, in the present example the bumper 692 and corresponding ends of the bezel sections 644, 648 may be configured to interlock one end of the bumper with one section of the bezel and allow the other end to move relative to the other section.

Figure 10:
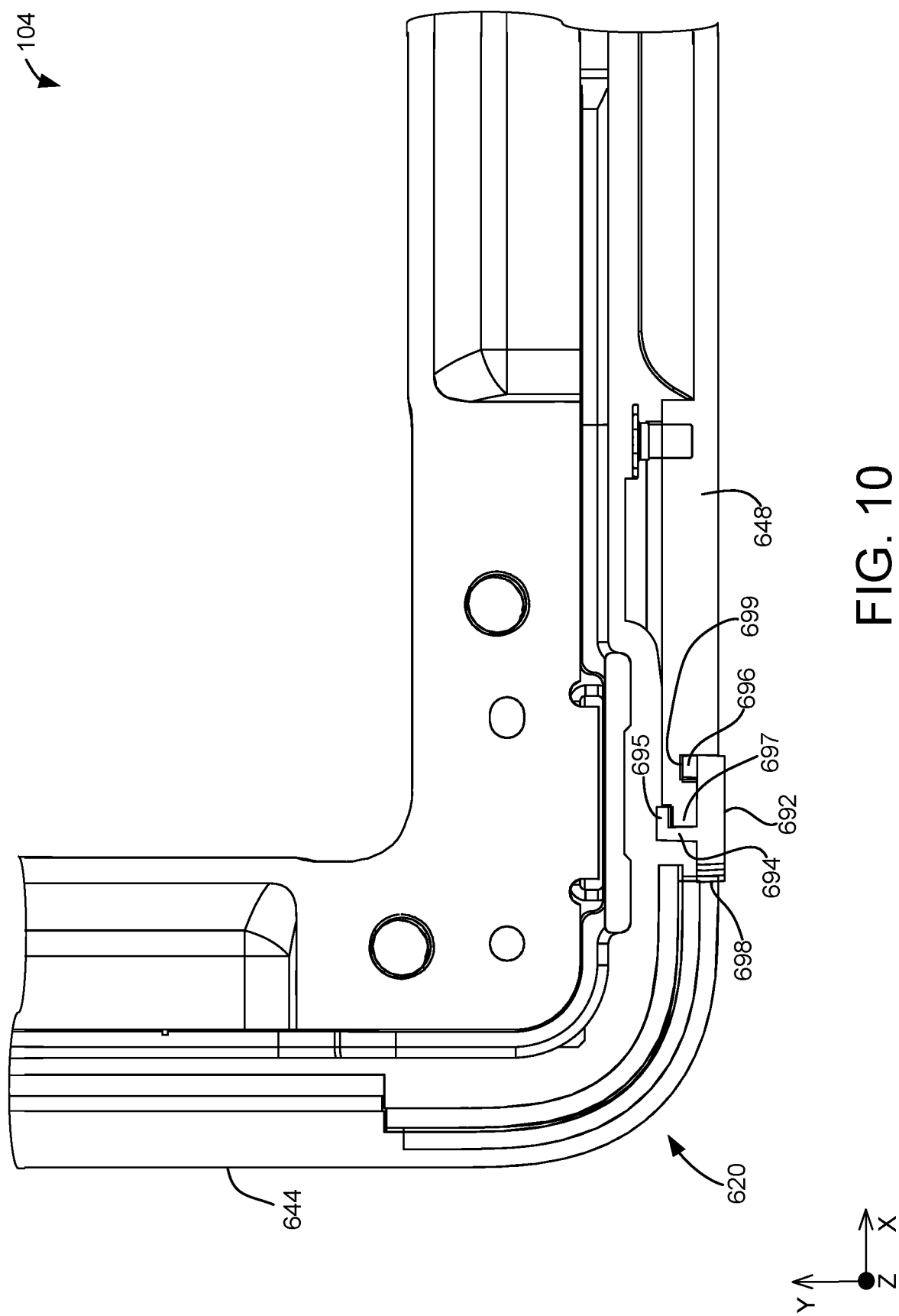
FIG. 10 shows a partial top-down view of the corner of the display device of FIG. 6.

For example, FIG. 10 illustrates a top-down view of the display device 104 of FIGS. 6-9. As illustrated in FIG. 10, the bumper 692 may comprise a first projection 694 and a second projection 696 that interlock with corresponding structures on the second section 648 of the bezel 108. In this example, the first projection 694 is configured as an L-shaped projection that includes a securing feature 695 that receives and retains a corresponding projection 697 in the end face of the second section 648.

In a similar manner, the second projection 696 is received and retained in a slot 699 formed in the second section 648. The bumper 692 also comprises a flat end surface 698 facing the end face 700 of the first section 644 of the bezel 108. With this configuration, the bumper 692 is securely affixed to the second section 648 of the bezel 108, and also may move freely against the end face 700 of the first section 644 of the bezel. In this manner, the bumper 692 may present a consistent and pleasing appearance of the bezel when installed, and may avoid becoming tilted or otherwise askew when the two sections of the bezel 108 are misaligned.

Figure 11:
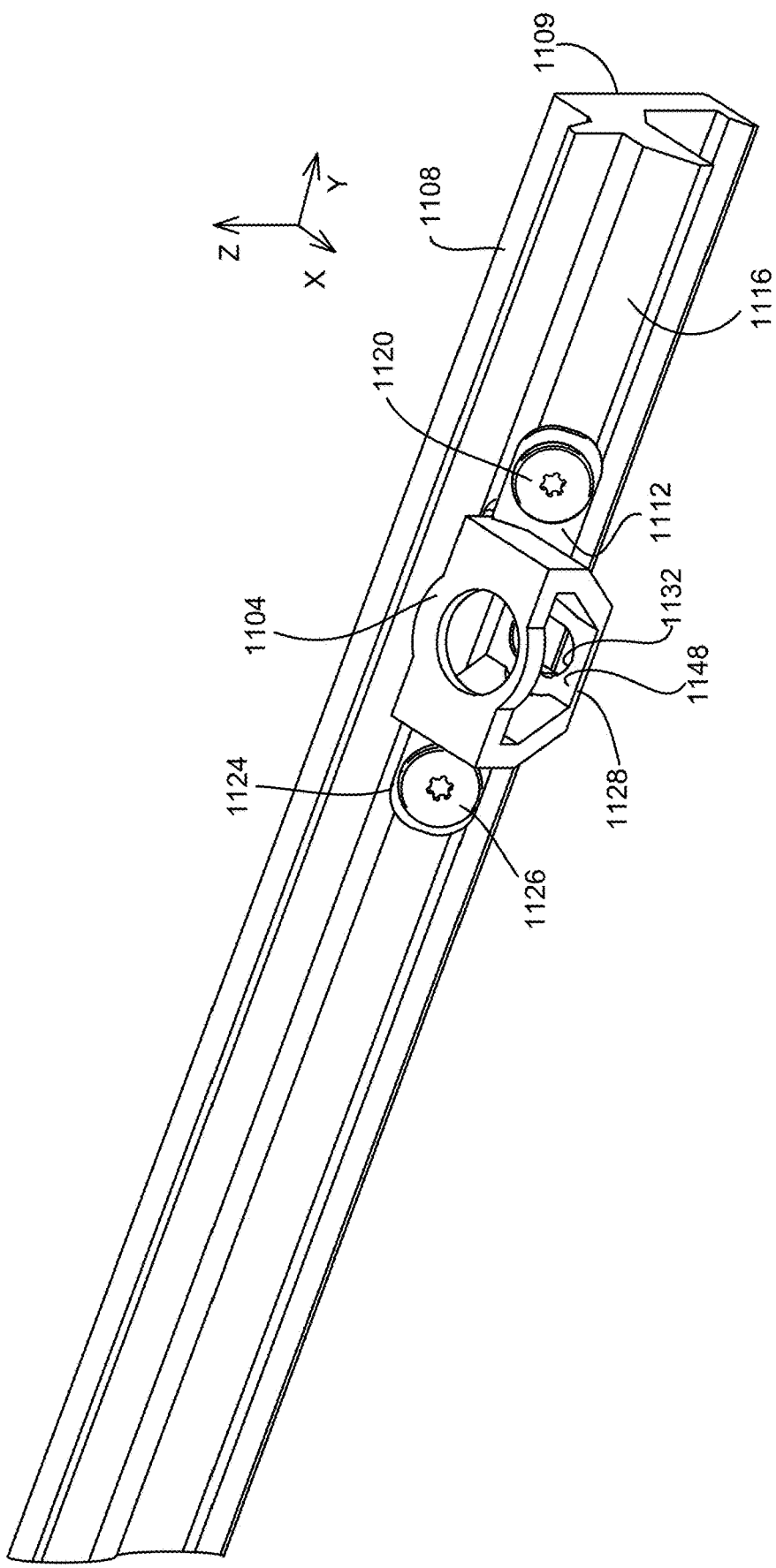
FIG. 11 illustrates another example of a side mounting bracket according to examples of the present disclosure.
Figure 12:
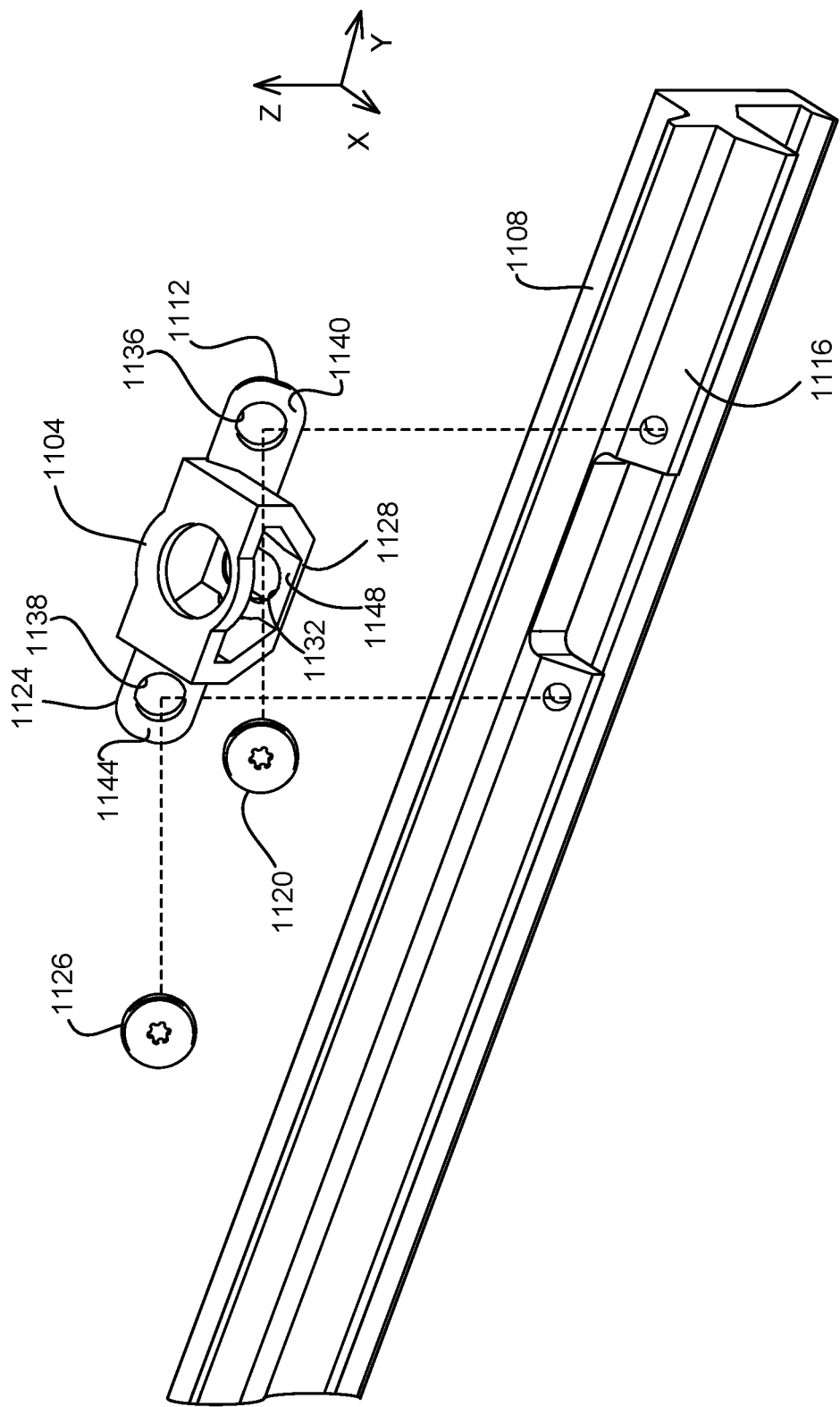
FIG. 12 shows an exploded view of the side mounting bracket of FIG. 11.

With reference now to FIGS. 11 and 12, in some examples a side mounting bracket may comprise at least one tongue that is affixed to a bezel with a mechanical fastener. As described in more detail below, this mounting bracket and bezel configuration also enables three-dimensional positioning of the bezel relative to the display unit in all three x, y and z directions. In the example of FIGS. 11 and 12, side mounting bracket 1104 is mounted to a bezel 1108 by affixing a first tongue 1112 to an angled inner lip 1116 of the bezel. As shown in these figures, the inner lip 1116 is angled downwardly relative to the x-axis to form an angle between 0 and 90 degrees with respect to the outer sidewall 1109 of the bezel 1108.

In this example, the first tongue 1112 is affixed to the inner lip 1116 by a screw 1120. A second tongue 1124 extends from an opposite side of the mounting bracket 1104 from first tongue 1112. The second tongue 1124 is also affixed to the inner lip 1116 of the bezel 1108 by a screw 1126.

Further, and like the side mounting bracket 212 in the example of FIGS. 2-5, the side mounting bracket 1104 comprises a display unit attachment portion 1128 configured to be affixed to a display unit of a display device. For example, one or more fasteners, such as screws, may extend through an aperture 1132 in the display unit attachment portion 1128 and into one or more corresponding apertures in the display unit.

In some examples, the first and second tongues 1112, 1124 of the side mounting bracket 1104 may be affixed to the bezel 1108 after affixing the side mounting bracket 1104 to the display unit as described above. Further and like the side mounting bracket 212 described above, the tongues 1112, 1124 and the inner lip 1116 of the bezel 1108 may be configured to contact and move relative to each other prior to affixing the side mounting bracket 1104 to the display unit. Utilizing this configuration may avoid the generation of internal stress in components of the display device.

To accommodate such movement between the tongues 1112, 1124 and the inner lip 1116, each of the tongues may comprise a screw slot 1136, 1138 having a diameter that is larger than a shank of the corresponding screw 1120, 1126. Accordingly, each screw 1120, 1126 may be fastened in a variety of positions within the corresponding screw slot 1136, 1138, thereby providing tolerance for changes in the position and orientation of the side mounting bracket 1104 relative to the bezel 1108. In this manner, the angled inner lip 1116 combined with this fastener configuration enables three-dimensional positioning of the bezel relative to the display unit in all three x, y and z directions.

In the example of FIGS. 11-12, each tongue 1112, 1124 also comprises a planar surface 1140, 1144 that is angled with respect to a planar face 1148 of the display unit attachment portion 1128. In this manner, the angled tongues 1112, 1124 may enable movement of the side mounting bracket 1104 in the z-axis direction while the planar face 1148 of the display unit attachment portion 1128 provide a connection point to a corresponding portion of the display unit, such as shown in FIG. 3.

Figure 13:
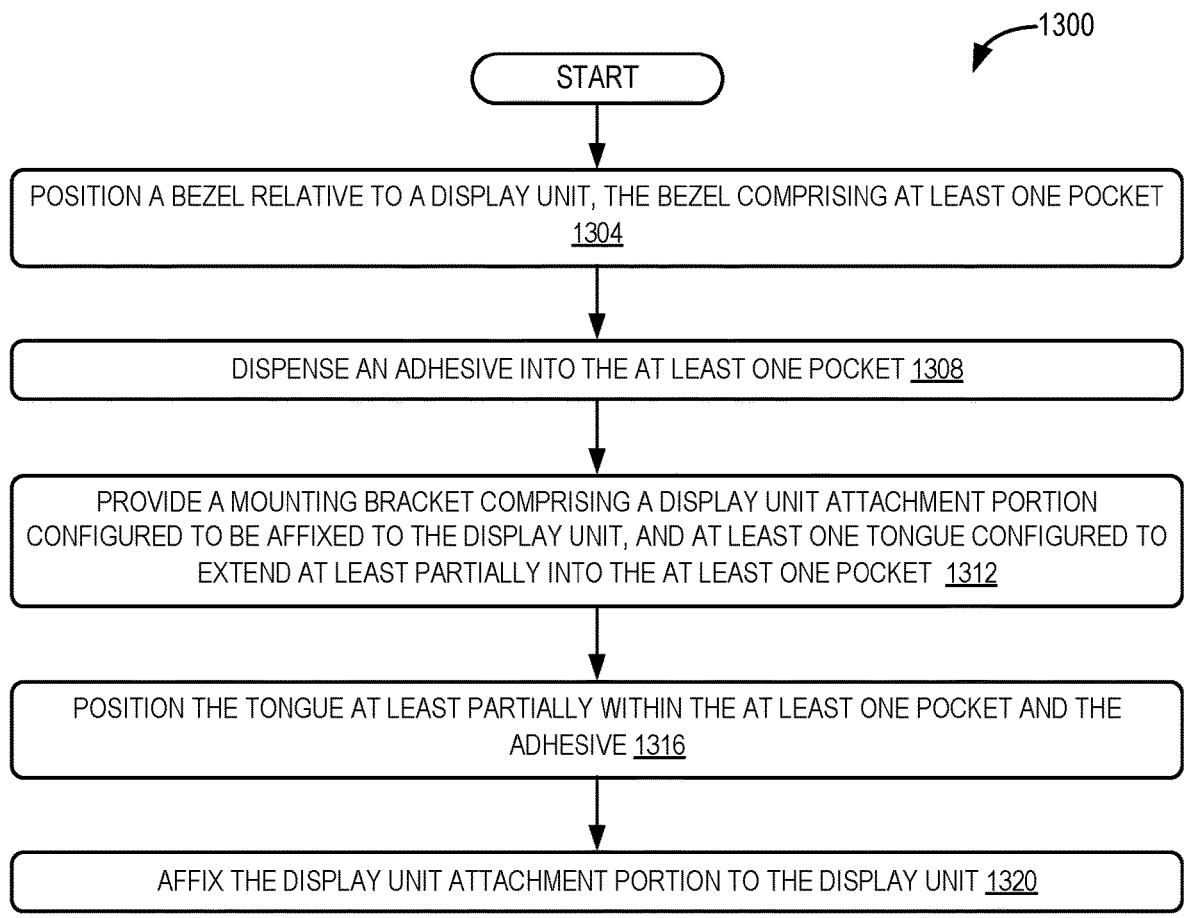
FIG. 13 is a block diagram of a method for assembling a display device according to examples of the present disclosure.

With reference now to FIG. 13, a flow diagram is provided depicting an example method 1300 for assembling a display device. The following description of method 1300 is provided with reference to the components described herein and shown in FIGS. 1-10, but it will be appreciated that method 1300 also may be performed in other contexts using other suitable components.

At 1304, the method 1300 includes positioning a bezel relative to a display unit, the bezel comprising at least one pocket. At 1308, the method 1300 includes dispensing an adhesive into the at least one pocket. At 1312, the method 1300 includes providing a mounting bracket comprising a display unit attachment portion configured to be affixed to the display unit, and at least one tongue configured to extend at least partially into the at least one pocket. At 1316, the method 1300 includes positioning the tongue at least partially within the at least one pocket and the adhesive. At 1320, the method 1300 includes affixing the display unit attachment portion to the display unit.

The following paragraphs provide additional support for the claims of the subject application. One aspect provides a display device, comprising: a display unit; a bezel comprising at least one pocket; a mounting bracket comprising a display unit attachment portion affixed to the display unit and at least one tongue that extends at least partially into the at least one pocket; and an adhesive binding the at least one tongue to at least one surface of the at least one pocket, thereby coupling the bezel to the display unit via the mounting bracket.

The display device may additionally or alternatively include, wherein: the mounting bracket comprises a first tongue and a second tongue; the bezel comprises a first pocket and a second pocket; the first tongue extends at least partially into the first pocket; and the second tongue extends at least partially into the second pocket. The display device may additionally or alternatively include, wherein the first tongue and the second tongue extend from opposite ends of the mounting bracket.

The display device may additionally or alternatively include, wherein the at least one pocket comprises a U-shaped groove. The display device may additionally or alternatively include, wherein the at least one tongue comprises an L-shaped flange.

The display device may additionally or alternatively include, wherein the bezel is affixed to an underside of a display surface. The display device may additionally or alternatively include, wherein the at least one pocket is located in a corner of the bezel. The display device may additionally or alternatively include, wherein the bezel comprises a plurality of pockets, and the display device further comprises a plurality of mounting brackets, each mounting bracket of the plurality of mounting brackets comprising at least one tongue that extends at least partially into one of the plurality of pockets.

The display device may additionally or alternatively include, wherein the bezel comprises a plurality of independent sections. The display device may additionally or alternatively include a bumper positioned between two of the independent sections of the bezel. The display device may additionally or alternatively include, wherein the bumper is interlocked with one of the two independent sections of the bezel and is not interlocked with the other independent section of the bezel.

The display device may additionally or alternatively include, wherein a first section of the bezel comprises the at least one pocket, and a second section of the bezel comprises a boss affixed to a bezel attachment portion of the mounting bracket. The display device may additionally or alternatively include, wherein the bezel attachment portion is angled relative to an inner sidewall of the bezel.

Another aspect provides a mounting bracket for securing a bezel to a display unit of a display device, the mounting bracket comprising: a display unit attachment portion configured to be affixed to the display unit; and at least one tongue configured to extend at least partially into at least one pocket within the bezel, wherein an adhesive binds the at least one tongue to at least one surface of the at least one pocket, thereby coupling the bezel to the display unit via the mounting bracket.

The mounting bracket may additionally or alternatively include, wherein the at least one tongue comprises a first tongue configured to extend at least partially into a first pocket within the bezel and a second tongue configured to extend at least partially into a second pocket within the bezel. The mounting bracket may additionally or alternatively include, wherein the first tongue and the second tongue extend from opposite ends of the mounting bracket. The mounting bracket may additionally or alternatively include, wherein the at least one tongue comprises an L-shaped flange.

The mounting bracket may additionally or alternatively include, wherein the at least one tongue is configured to extend at least partially into the least one pocket within a first section of the bezel, the mounting bracket further comprising a bezel attachment portion configured to be affixed to a boss on the bezel. The mounting bracket may additionally or alternatively include, wherein the bezel attachment portion is angled relative to an inner sidewall of the bezel when the bezel is affixed to the display unit.

Another aspect provides a method for assembling a display device, the method comprising: positioning a bezel relative to a display unit of the display device, the bezel comprising at least one pocket; dispensing an adhesive into the at least one pocket; providing a mounting bracket comprising a display unit attachment portion configured to be affixed to the display unit, and at least one tongue configured to extend at least partially into the at least one pocket; positioning the tongue at least partially within the at least one pocket and the adhesive; and affixing the display unit attachment portion to the display unit.

Another aspect provides a mounting bracket for securing a bezel to a display unit of a display device, the mounting bracket comprising: a display unit attachment portion comprising a planar face configured to be affixed to the display unit; and at least one tongue configured to be affixed to an inner lip of the bezel, the at least one tongue comprising a planar surface that is angled with respect to the planar face of the display unit attachment portion.

The mounting bracket may additionally or alternatively include, wherein the at least one tongue comprises: a first tongue configured to be affixed to a first location on the inner lip of the bezel; and a second tongue configured to be affixed to a second location on the inner lip of the bezel. The mounting bracket may additionally or alternatively include, wherein the first tongue and the second tongue extend from opposite ends of the mounting bracket.

It will be understood that the configurations and/or approaches described herein are exemplary in nature, and that these specific embodiments or examples are not to be considered in a limiting sense, because numerous variations are possible. The specific routines or methods described herein may represent one or more of any number of manufacturing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof. As used herein, an element or step recited in the singular and preceded by "a" or "an" should be understood as not necessarily excluding two or more of such elements or steps. Further, references to "one example" are not intended to be interpreted as excluding the existence of additional examples that also incorporate the recited features. Additionally, unless explicitly stated to the contrary, examples "comprising" or "having" an element or multiple elements having a particular condition may include additional elements not having that condition.

The invention claimed is:

1. A mounting bracket for securing a bezel to a display unit of a display device, the mounting bracket comprising:
   a display unit attachment portion comprising a planar face configured to be affixed to the display unit;
   the display unit attachment portion comprising a first planar tongue configured to be affixed to a first location on an inner lip of the bezel, the first planar tongue comprising a first planar surface that extends laterally in a first direction from the display unit attachment portion and is angled with respect to the planar face of the display unit attachment portion, the first planar surface configured to abut a first lip planar surface on the inner lip of the bezel, wherein the first planar tongue comprises a first slot and is affixed to the inner lip of the bezel by a first fastener comprising a first shank that extends through the first slot; and
   the display unit attachment portion comprising a second planar tongue configured to be affixed to a second location on the inner lip of the bezel, the second planar tongue comprising a second planar surface that extends laterally in a second direction colinear with and opposite to the first direction from the display unit attachment portion and is angled with respect to the planar face of the display unit attachment portion, the second planar surface configured to abut a second lip planar surface on the inner lip of the bezel, wherein the second planar tongue comprises a second slot and is affixed to the inner lip of the bezel by a second fastener comprising a second shank that extends through the second slot.

2. The mounting bracket of claim 1, wherein the planar face defines an aperture configured to receive the first fastener that extends through the aperture and into one or more corresponding apertures in the display unit.

3. The mounting bracket of claim 1, wherein the inner lip of the bezel is angled with respect to an outer sidewall of the bezel.

4. The mounting bracket of claim 3, wherein the inner lip is angled downwardly to form an angle between 0 and 90 degrees with respect to the outer sidewall of the bezel.

5. The mounting bracket of claim 1, wherein the first slot has a diameter that is larger than the first shank of the first fastener, thereby allowing the first fastener to be fastened in a variety of positions within the first slot to provide tolerance for changes in a position and orientation of the mounting bracket relative to the bezel.

6. The mounting bracket of claim 1, wherein the first planar tongue and the inner lip of the bezel are configured to contact and move relative to each other prior to affixing the mounting bracket to the display unit.

7. A display device, comprising:
   a display unit;
   a bezel comprising an inner lip; and
   a mounting bracket comprising:
      a display unit attachment portion comprising a planar face configured to be affixed to the display unit;
      the display unit attachment portion comprising a first planar tongue configured to be affixed to a first location on the inner lip of the bezel, the first planar tongue comprising a first planar surface that extends laterally in a first direction from the display unit attachment portion and is angled with respect to the planar face of the display unit attachment portion, the first planar surface configured to abut a first lip planar surface on the inner lip of the bezel, wherein the first planar tongue comprises a first slot and is affixed to the inner lip of the bezel by a first fastener comprising a first shank that extends through the first slot; and
      the display unit attachment portion comprising a second planar tongue configured to be affixed to a second location on the inner lip of the bezel, the second planar tongue comprising a second planar surface that extends laterally in a second direction colinear with and opposite to the first direction from the display unit attachment portion and is angled with respect to the planar face of the display unit attachment portion, the second planar surface configured to abut a second lip planar surface on the inner lip of the bezel, wherein the second planar tongue comprises a second slot and is affixed to the inner lip of the bezel by a second fastener comprising a second shank that extends through the second slot.

8. The display device of claim 7, wherein the planar face defines an aperture configured to receive the first fastener that extends through the aperture and into one or more corresponding apertures in the display unit.

9. The display device of claim 7, wherein the inner lip of the bezel is angled with respect to an outer sidewall of the bezel.

10. The display device of claim 9, wherein the inner lip is angled downwardly to form an angle between 0 and 90 degrees with respect to the outer sidewall of the bezel.

11. The display device of claim 7, wherein the first slot has a diameter that is larger than the first shank of the first fastener, thereby allowing the first fastener to be fastened in a variety of positions within the first slot to provide tolerance for changes in a position and orientation of the mounting bracket relative to the bezel.

12. The display device of claim 7, wherein the first planar tongue and the inner lip of the bezel are configured to contact and move relative to each other prior to affixing the mounting bracket to the display unit.

13. A method for assembling a display device, the method comprising:
   positioning a bezel relative to a display unit of the display device;
   providing a mounting bracket comprising:
      a display unit attachment portion comprising a planar face configured to be affixed to the display unit;
      the display unit attachment portion comprising a first planar tongue configured to be affixed to a first location on an inner lip of the bezel, the first planar tongue comprising a first planar surface that extends laterally in a first direction from the display unit attachment portion and is angled with respect to the planar face of the display unit attachment portion, the first planar surface configured to abut a first lip planar surface on the inner lip of the bezel, wherein the first planar tongue comprises a first slot and is affixed to the inner lip of the bezel by a first fastener comprising a first shank that extends through the first slot; and the display unit attachment portion comprising a second planar tongue configured to be affixed to a second location on the inner lip of the bezel, the second planar tongue comprising a second planar surface that extends laterally in a second direction colinear with and opposite to the first direction from the display unit attachment portion and is angled with respect to the planar face of the display unit attachment portion, the second planar surface configured to abut a second lip planar surface on the inner lip of the bezel, wherein the second planar tongue comprises a second slot and is affixed to the inner lip of the bezel by a second fastener comprising a second shank that extends through the second slot; and affixing the first planar tongue and the second planar tongue to the inner lip of the bezel.

14. The method of claim 13, wherein the first planar tongue and the second planar tongue extend from opposite ends of the mounting bracket, the method further comprising:

affixing the first planar tongue to the first location on the inner lip of the bezel; and affixing the second planar tongue to the second location on the inner lip of the bezel.

* * * * *